United States Patent
Masleid

(10) Patent No.: US 7,071,747 B1
(45) Date of Patent: Jul. 4, 2006

(54) INVERTING ZIPPER REPEATER CIRCUIT

(75) Inventor: Robert P. Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/869,012

(22) Filed: Jun. 15, 2004

(51) Int. Cl.
*H03K 5/12* (2006.01)

(52) U.S. Cl. ............................. 327/170; 327/376

(58) Field of Classification Search ............ 327/112, 327/170, 375, 376, 227
See application file for complete search history.

(56) References Cited

U.S. PATENT DOCUMENTS

| | | | |
|---|---|---|---|
| 5,610,548 A | 3/1997 | Masleid | 327/374 |
| 5,699,000 A * | 12/1997 | Ishikuri | 327/108 |
| 5,926,050 A * | 7/1999 | Proebsting | 327/170 |
| 6,025,738 A * | 2/2000 | Masleid | 326/83 |
| 6,043,698 A * | 3/2000 | Hill | 327/333 |
| 6,066,958 A * | 5/2000 | Taniguchi et al. | 326/27 |
| 6,532,544 B1 | 3/2003 | Masleid et al. | 713/500 |
| 6,577,176 B1 * | 6/2003 | Masleid et al. | 327/199 |
| 6,608,505 B1 * | 8/2003 | Tsuji | 327/108 |
| 6,630,851 B1 | 10/2003 | Masleid et al. | 327/165 |
| 6,731,140 B1 | 5/2004 | Masleid et al. | 327/99 |
| 6,838,906 B1 * | 1/2005 | Yen | 326/81 |
| 2002/0101945 A1 * | 8/2002 | Audy et al. | 375/351 |

* cited by examiner

*Primary Examiner*—Terry D. Cunningham
*Assistant Examiner*—Thomas J Hiltunen

(57) ABSTRACT

Repeater circuits including an inverting zipper repeater circuit and an inverting gain-enhanced repeater circuit are described.

6 Claims, 3 Drawing Sheets

INVERTING ZIPPER REPEATER CIRCUIT

TECHNICAL FIELD

Embodiments of the present invention relate to the field of clock distribution on a microprocessor chip, and more particularly to repeater circuits for VLSI chips.

BACKGROUND ART

In large high-performance very large scale integration (VLSI) chips, an internal clock signal is distributed throughout the chip to control timing of the chip as a function of an external system clock. The internal clock signal is typically generated from the external clock by a clock buffer circuit, and then distributed to the end circuits in the chip through some form of on-chip clock distribution network. However, in the clock distribution network resistance and inductance of the transmission lines can limit the distribution of the clock signal throughout the VLSI chip. Thus, it would be advantageous to counter the transmission line signal loss of a clock signal in a VLSI chip.

DISCLOSURE OF THE INVENTION

Embodiments of the present invention describe repeater circuits including an inverting zipper repeater circuit and an inverting gain-enhanced repeater circuit, for instance.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODES FOR CARRYING OUT THE INVENTION

Reference will now be made in detail to the preferred embodiments of the present invention, repeater circuits that aid the distribution of clock signals throughout a very large scale integration (VLSI) chip, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention are directed toward repeater circuits to facilitate the propagation of data signals (e.g., clock signals) across a long wire (e.g., in a VLSI chip). In conventional integrated circuit technology, data signals which propagate across long wires typically degrade due to fan-out, resistance, capacitance, and power problems which degrade the data signal (e.g., increase the transition time for a rising or falling edge of a data signal). For instance, as transition times increase, the system operates at slower clock speeds in order to allow the data signal to fully transition so that valid data may be processed. Wires as long as 1 mm may be considered too long, especially for systems operating at higher clock speeds. In order to preserve the data integrity, and to maintain acceptable transition times, buffers, or repeaters, are often placed periodically along a long wire in order to amplify the data signal as well as to maintain fast transition times. Embodiments of the present invention and their benefits are further described below.

Figure 1:
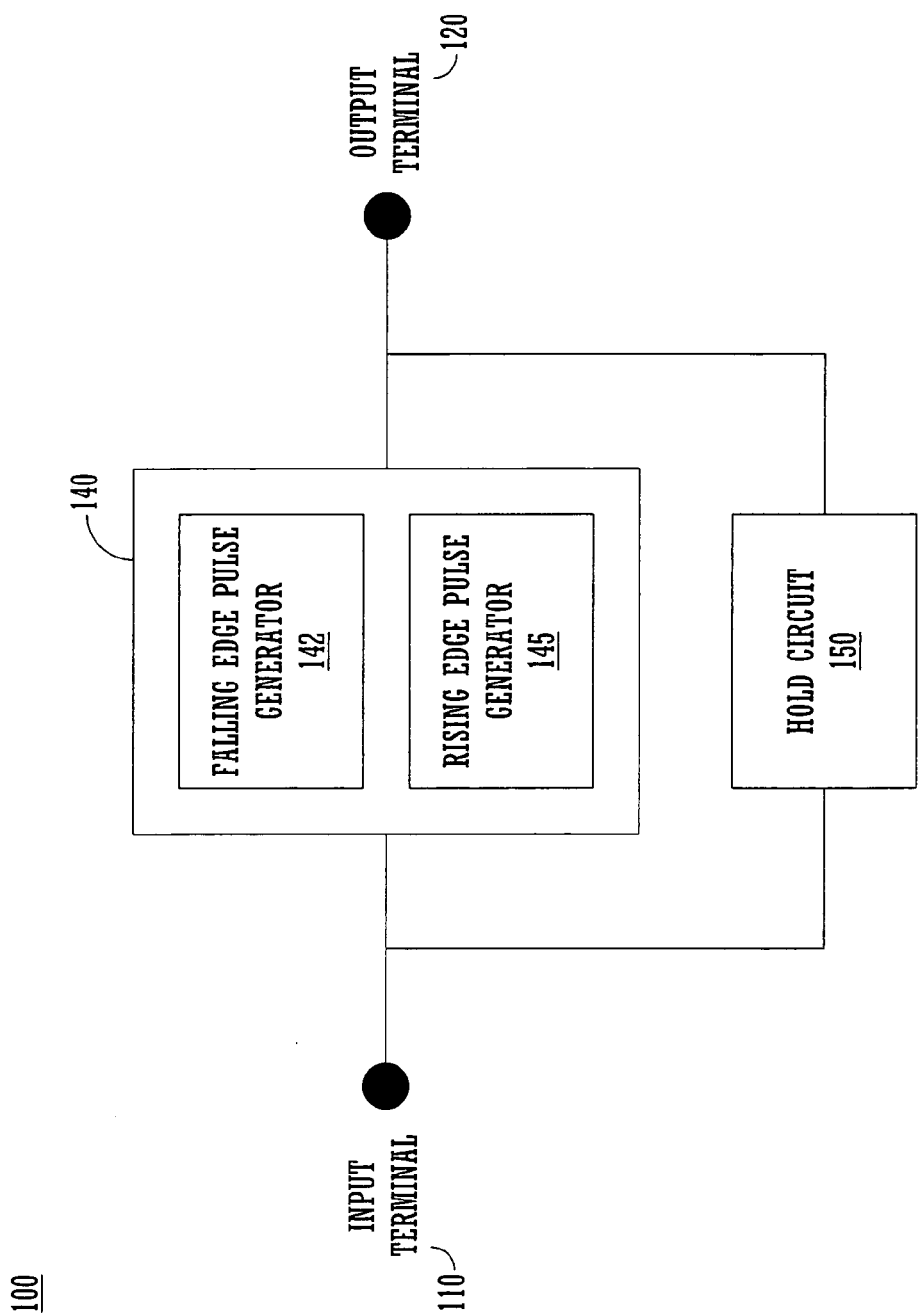
FIG. 1 is a block diagram illustrating a repeater circuit, in accordance with one embodiment of the present invention.

FIG. 1 illustrates a high-level block diagram of a repeater, or buffer, circuit 100 that is capable of maintaining the integrity of a data signal across long wires through a VLSI chip, in accordance with one embodiment of the present invention.

The repeater circuit 100 generally includes an input terminal that is associated with an input signal (e.g., clock signal). The input signal includes a rising edge and a falling edge every clock cycle. An output terminal 120 provides an output signal for the repeater circuit 100.

The repeater circuit 100 includes a holding circuit 150 that is electrically coupled to the input terminal 110 and to the output terminal 120. The holding circuit 150 is configured to maintain the state of the output terminal 120.

A pulse generator circuit 140 is electrically configured to receive the input signal from the input terminal 110. The pulse generator circuit 140 can be divided into two separate circuits: a falling edge subcircuit 142, and a rising edge subcircuit 145.

The falling edge subcircuit 142 is coupled to the holding subcircuit 150, and includes a delay chain of inverters coupled in series with a first pulse generator to generate a falling output transition at the output terminal 120. That is, the falling edge subcircuit 142 is configured to react to the rising edge of the input signal and outputs a falling edge transition for the output signal at the output terminal 120. The falling edge subcircuit 142 ends the falling edge output transition before a falling edge appears on the input signal.

Alternatively, the rising edge subcircuit 145 is coupled to the holding subcircuit 150, and includes the same delay chain of inverters coupled in series with a second pulse generator that generates a rising output transition at the output terminal 120. The rising edge subcircuit 145 is configured to react to the falling edge of the input signal and outputs a rising edge transition for the output signal at the output terminal 120. The rising edge subcircuit 145 ends the rising edge output transition before a rising edge appears on the input signal.

In particular, during operation of the repeater circuit 100, when a rising edge of the input signal is detected, the falling edge subcircuit 142 receives the input signal and outputs a falling-edge pulse to drive the output terminal 120 low. Similarly, when a falling edge of the input signal is detected, the rising edge subcircuit 145 receives the input signal and outputs a rising-edge pulse to drive the output terminal 120 high.

The repeater circuit 100 is able to avoid the gain loss from crowbar currents that occur when field effect transistors in both the rising edge and falling edge subcircuits of conventional repeaters are on during a rising or falling transition, which forms a crowbar current from the supply voltage to ground. In particular, in order to avoid crowbar currents and other problems associated with a conventional repeater circuit, the repeater circuit 100 is capable of separating the operation of the falling edge subcircuit 142 from the rising edge subcircuit 145. That is, the repeater circuit 100 is able to end the rising-edge pulse from the rising edge subcircuit 145 at the output terminal 120 before the rising edge of the input signal is detected, at which point the falling edge subcircuit 142 begins to operate.

In general, after the rising edge subcircuit 145 is turned off, and no longer driving the output terminal, the holding subcircuit 150 maintains the state of the output signal at the output terminal 120. As such, the rising edge subcircuit 145 is not interfering with the operation of the falling edge subcircuit 142 on the rising edge of the input signal, which reduces the effects of crowbar current. As a result, during either the rising edge or falling edge of the input signal, only the corresponding rising edge or falling edge subcircuit is operating, which reduces the effects of crowbar current in the repeater circuit 100.

In one embodiment, the repeater circuit 100 provides for limited amplification or current gain. That is, a series of repeater circuits 100 maintains the signal strength and characteristics from one end of a wire to the other end of a wire in a VLSI chip. In another embodiment, the repeater circuit 100 provides greater amplification or current gain. That is, the repeater circuit 100 is used to amplify the signal strength and characteristics of an input signal.

Figure 2:
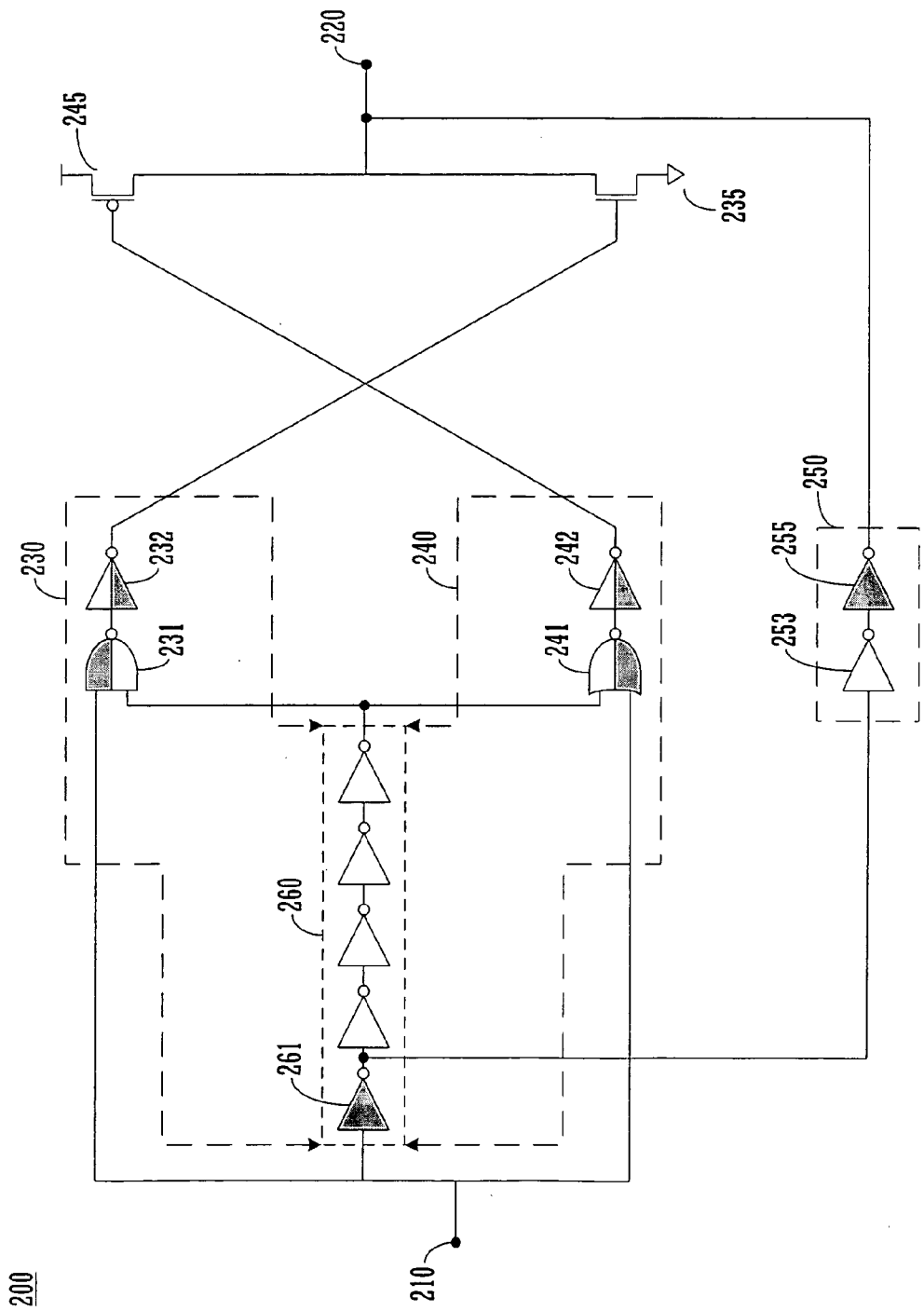
FIG. 2 is a block diagram illustrating an inverting gain-enhanced repeater circuit, in accordance with one embodiment of the present invention.

FIG. 2 is a schematic diagram of an inverting gain enhanced repeater circuit 200 that is capable of maintaining the integrity of a data signal across long wires through a VLSI chip, in accordance with one embodiment of the present invention. The circuit 200 is a further illustration of the top level diagram of the repeater circuit 100 of FIG. 1, in one embodiment.

The inverting gain enhanced repeater circuit 200 includes two edge-triggered pulse generators 230 and 240, a delay chain of inverters 260, and a holding subcircuit 250. When an input signal 210 (e.g., input clock signal) transitions, the edge triggered pulse generator 230 drives the output transistor 235, and similarly, the edge triggered pulse generator 240 drives the output transistor 245. The output of the two output transistors 235 and 245 creates an output signal (e.g., output clock signal) 220. In one embodiment, the output transistor 245 is a p-type field effect transistor (PFET), and the output transistor 235 is an n-type field effect transistor (NFET).

The first edge triggered pulse generator 230, also called a falling edge triggered pulse generator 230, includes the delay chain of inverters 260 that is coupled to receive the input signal, the NAND gate 231 and inverter 232. The inverter 232 amplifies the signal from the NAND gate 231. In addition, the NAND gate 231 and inverter 232 are skewed to react quickly to a rising edge of the input signal 210. The input to the inverter delay chain 260 is the input signal 210, and the input to the NAND gate 231 is both the input signal 210 and the output from the inverter delay chain 260.

The falling edge triggered pulse generator 230 is triggered by the rising edge of the input signal 210, and provides a first pulse signal that drives the output transistor, NFET 235, for generating a falling output transition for the output signal 220.

The second edge triggered pulse generator 240, also called a rising edge triggered pulse generator 240, includes the delay chain of inverters 260 that is coupled to receive the input signal, the NOR gate 241 and static inverter 242. The input to the inverter delay chain 260 is the input signal 210, and the input to the NOR gate 241 is both the input signal 210 and the output from the inverter delay chain 260.

The static inverter 242 amplifies the signal from the NOR gate 241. In addition, the NOR gate 241 and inverter 242 are skewed to react quickly to a falling edge of the input signal 210.

The rising edge triggered pulse generator 240 is triggered by the falling edge of the input signal 210, and provides a first pulse signal that drives the output transistor, PFET 245, for generating a rising output transition for the output signal 220.

In general, during operation, on detecting the rising edge of the input signal 210, the falling edge pulse generator 230 briefly activates the output transistor, NFET 235, and then deactivates the output transistor, NFET 235, before the falling edge of the input signal 210 begins. On the falling edge of the input signal 210, the rising edge pulse generator 240 briefly activates the output transistor, PFET 245, and then deactivates the output transistor, PFET 245, before the rising edge of the input signal 210 begins.

Between the rising edge and falling edge transitions, a holding circuit 250, coupled to receive the input signal 210 and coupled to the output terminal associated with the output signal, holds the state of the output terminal. The holding circuit 250 includes the inverters 261, 253, and 255 coupled in series with the output terminal associated with the output signal 220.

Additionally, the gates and inverters of FIG. 2 include shaded portions. These shaded portions refer to the relative size of the devices within the gates and inverters of the component that is shaded. That is, for each particular component of the inverting gain-enhanced circuit 200, the shaded portions refer to transistors that are deliberately downsized in relation to normally sized devices in the prior art inverter or gate device. For components that are fully shaded, both the rising and falling transistors in that gate are deliberately downsized. For components that are shaded on the top half, PFET devices within the gate or inverter are deliberately downsized. For components that are shaded on the bottom half, NFET devices within that gate or inverter are deliberately downsized.

For example, inverters 261 and 255 are fully shaded, which means that both PFETs and NFETs are deliberately downsized. Also, NAND gate 231 and inverter 242 are shaded on the upper portion, which means that PFETs are deliberately downsized. For instance, in NAND gate 231, PFETs are of a relatively smaller size compared to NFETs in NAND gate 231. Further, NOR gate 241 and inverter 232 are shaded on the lower portion, which means that NFETs are deliberately downsized. For instance, in NOR gate 241, NFETs are of a relatively smaller size compared to PFETs in NOR gate 241.

According to the present invention, by separately driving the output transistors, NFET 235 and PFET 245, this guarantees that the opposing output transistor is shut down before the next input transition begins, which reduces the effects of crowbar current. In addition, because the inverter gain-enhanced circuit 200 is designed such that the gain for opposite transitions is realized separately in the NOR gate 235 and the NAND gate 245, and similarly in inverters 232 and 242, the critical rising and falling edges propagate faster through the inverter gain-enhanced circuit 200 than the reverse non-critical edges.

Figure 3:
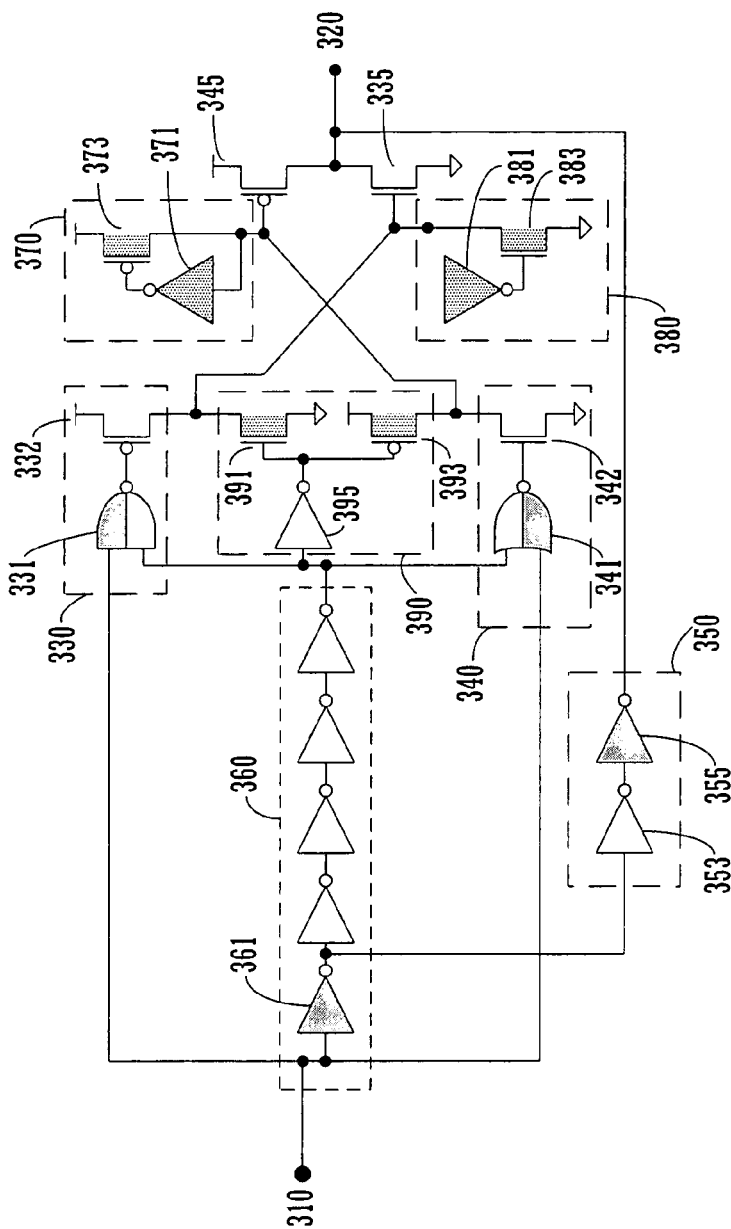
FIG. 3 is a block diagram illustrating an inverting zipper repeater circuit, in accordance with one embodiment of the present invention.

FIG. 3 is a schematic diagram of an inverting zipper repeater circuit 300 that is capable of maintaining the integrity of a data signal across long wires through a VLSI chip, in accordance with one embodiment of the present invention. The circuit 300 is a further illustration of the top level diagram of the repeater circuit 100 of FIG. 1, in another embodiment.

The inverting zipper repeater circuit 300 includes two edge-triggered pulse generators 330 and 340, a delay chain of inverters 360, and a holding subcircuit 350. When an input signal 310 (e.g., input clock signal) transitions, the edge triggered pulse generator 330 drives the output transistor 335, and similarly, the edge triggered pulse generator 340 drives the output transistor 345. The output of the two output transistors 335 and 345 creates an output signal (e.g., output clock signal) 320. In one embodiment, the output transistor 345 is a PFET, and the output transistor 335 is an NFET.

The first edge triggered pulse generator 330, also called a falling edge triggered pulse generator 330, includes the delay chain of inverters 360 that is coupled to receive the input signal, the NAND gate 331 and PFET 332. The input to the inverter delay chain 360 is the input signal 310, and the input to the NAND gate 331 is both the input signal 310 and the output from the inverter delay chain 360.

The falling edge triggered pulse generator 330 is triggered by the rising edge of the input signal 310, and provides a first pulse signal that drives the output transistor, NFET 335, for generating a falling output transition for the output signal 320.

The PFET 332 provides an intermediate precharge inverting stage for the falling edge triggered pulse generator 330. The precharge inverting stage includes the PFET 332 coupled at one end to a positive supply voltage and at the other end to the upper half of the restoring stage 390. The inverting zipper repeater 300 has an advantage over the inverting gain-enhanced repeater 200 of FIG. 2 in that the PFET 332 need only reach its threshold voltage in order to begin switching output NFET 335. This arrangement also decreases the capacitive load on NAND gate 331 of the falling edge triggered pulse generator 330.

The restoring stage restores the state of the precharge inverting stage that includes PFET 332. That is, a restoring transistor NFET 391 is used to restore the state of the PFET 332 after completion of the clocking of the rising edge of the input signal 310. The inverter 395 coupled at one end to the output of the delay chain 360 and at the other end to the NFET 391 drives the NFET 391 to restore the state of the PFET 332.

A half latch circuit 380 holds the state of the precharge level in the intermediate precharge inverting stage after the PFET 332 transistor turns off. The half latch circuit 380 includes an inverter 381 in a feedback loop coupled to an NFET 383 at its gate electrode. The NFET 383 is coupled between the output transistor NFET 335 that is also coupled to the input to the inverter 381 and ground. The NFET 383 acts as a clamp when the inverter 381 input is set to low.

The second edge triggered pulse generator 340, also called a rising edge triggered pulse generator 340, includes the delay chain of inverters 360 that is coupled to receive the input signal, the NOR gate 341 and NFET 342. The input to the inverter delay chain 360 is the input signal 310, and the input to the NOR gate 341 is both the input signal 310 and the output from the inverter delay chain 360.

The rising edge triggered pulse generator 340 is triggered by the falling edge of the input signal 310, and provides a pulse signal that drives the output transistor, PFET 345, for generating a rising output transition for the output signal 320.

The NFET 342 provides an intermediate precharge inverting stage for the rising edge triggered pulse generator 340. The precharge inverting stage includes the NFET 342 coupled at one end to the lower half of the restoring stage 390 and at the other end to ground. The inverting zipper repeater 300 has an advantage over the inverting gain-enhanced repeater 200 of FIG. 2 in that the NFET 342 need only reach its threshold voltage in order to begin switching output PFET 345. This arrangement also decreases the capacitive load on NOR gate 341 of the rising edge triggered pulse generator 340.

The restoring stage 390 restores the state of the precharge inverting stage that includes NFET 342. That is, a restoring transistor PFET 393 is used to restore the state of the NFET 342 after completion of the clocking of the falling edge of the input signal 310. The inverter 395 coupled at one end to the output of the delay chain 360 and at the other end to the PFET 393 drives the PFET 393 to restore the state of the NFET 342.

A half latch circuit 370 holds the state of the precharge level in the intermediate precharge inverting stage after the NFET 342 transistor turns off. The half latch circuit 370 includes an inverter 371 in a feedback loop coupled to a PFET 373 at its gate electrode. The PFET 373 is coupled between the output transistor PFET 345 that is also coupled to the input to the inverter 371 and a supply voltage. The PFET 373 acts as a clamp when the inverter 371 input is set to high.

In general, during operation, on detecting the rising edge of the input signal 310, the falling edge pulse generator 330 briefly activates the output transistor, NFET 335, and then deactivates the output transistor, NFET 335, before the falling edge of the input signal 310 begins. On the falling edge of the input signal 310, the rising edge pulse generator 340 briefly activates the output transistor, PFET 345, and then deactivates the output transistor, PFET 345, before the rising edge of the input signal 310 begins.

Between the rising edge and falling edge transitions, a holding circuit 350, coupled to receive the input signal 310 and coupled to the output terminal associated with the output signal, holds the state of the output terminal. The holding circuit 350 includes the inverters 361, 353, and 355 coupled in series with the output terminal associated with the output signal 320.

Additionally, the gates and inverters of FIG. 3 include shaded portions. These shaded portions refer to the relative size of the devices within the gates and inverters of the component that is shaded. That is, for each particular component of the zipper repeater circuit 300, the shaded portions refer to transistors that are deliberately downsized in relation to normally sized devices in the prior art inverter or gate device. For components that are fully shaded, both the rising and falling transistors in that gate are deliberately downsized. For components that are shaded on the top half, PFET devices within the gate or inverter are deliberately downsized. For components that are shaded on the bottom half, NFET devices within that gate or inverter are deliberately downsized.

For example, inverters 355, 361, 371, and 381 are fully shaded, which means that both PFETs and NFETs are deliberately downsized. In addition, NFETs 391 and 383 as well as PFETs 393 and 373 are deliberately downsized. Also, NAND gate 331 is shaded on the upper portion, which means that PFETs are deliberately downsized. For instance, in NAND gate 331, PFETs are of a relatively smaller size compared to NFETs in NAND gate 331. Further, NOR gate 341 is shaded on the lower portion, which means that NFETs are deliberately downsized. For instance, in NOR gate 341, NFETs are of a relatively smaller size compared to PFETs in NOR gate 341.

According to embodiments of the present invention, by separately driving the output transistors, NFET 335 and PFET 345, this guarantees that the opposing output transistor is shut down before the next clock transition begins, which reduces the effects of crowbar current. In addition, because the zipper repeater circuit 300 is designed such that the gain for opposite transitions is realized separately in the NOR gate 335 and the NAND gate 345, and similarly in the intermediate precharge inverting stages 332 and 342, the critical rising and falling edges propagate faster through the zipper repeater circuit 300.

Embodiments of the present invention, repeater circuits, are thus described. While the present invention has been described in particular embodiments, it should be appreciated that the present invention should not be construed as limited by such embodiments, but rather construed according to the below claims.

What is claimed is:

1. An inverting zipper repeater circuit comprising:
   a holding subcircuit coupled to receive an input signal and coupled to an output terminal;
   a delay chain of inverters coupled to receive said input signal;
   a first pulse generator comprising said delay chain inverters coupled to receive said input signal and for generating a rising output transition at said output terminal;
   a first latching circuit coupled an output node of said first pulse generator and to said output terminal, wherein said first pulse generator further comprises:
   a NOR gate with input nodes coupled to receive a signal from said delay chain of inverters and said input signal; and
   an NFET coupled to an output node of said NOR gate, said NFET coupled to said first latching circuit;
   a second pulse generator comprising said delay chain of inverters coupled to receive said input signal and for generating a falling output transition at said output terminal; and
   a second latching circuit coupled an output node of said second pulse generator and to said output terminal.

2. The inverting zipper repeater circuit of claim 1, wherein said first pulse generator is responsive to a falling edge of said input signal.

3. The inverting zipper repeater circuit of claim 1, wherein said second pulse generator is responsive to a rising edge of said input signal.

4. The inverting zipper repeater circuit of claim 1, wherein said latching circuit comprises:
   a precharge circuit coupled to said output node of said first pulse generator; and
   a half latch circuit coupled to said first output node.

5. The inverting zipper repeater circuit of claim 1, wherein said second pulse generator further comprises:
   a NAND gate with input nodes coupled to receive a signal from said delay chain of inverters and said input signal;
   a PFET coupled to an output node of said NAND gate, said PFET coupled to said second latching circuit.

6. The inverting zipper repeater circuit of claim 5, wherein said latching circuit comprises:
   a precharge circuit coupled to said output node of said second pulse generator; and
   a half latch circuit coupled to said second output node.

* * * * *